United States Patent
Zeng

(10) Patent No.: US 10,490,579 B2
(45) Date of Patent: Nov. 26, 2019

(54) MASK HAVING INTERMEDIATE LIGHT-TRANSMITTING SUB-SECTIONS OF STEPWISELY INCREASED TRANSMISSION RATES

(71) Applicant: Wuhan China Star Optoelectronics Technology Co., Ltd., Wuhan, Hubei (CN)

(72) Inventor: Shuanghua Zeng, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/769,311

(22) PCT Filed: Feb. 12, 2018

(86) PCT No.: PCT/CN2018/076544
§ 371 (c)(1),
(2) Date: Apr. 18, 2018

(87) PCT Pub. No.: WO2019/127872
PCT Pub. Date: Jul. 4, 2019

(65) Prior Publication Data
US 2019/0206909 A1    Jul. 4, 2019

(30) Foreign Application Priority Data
Dec. 28, 2017  (CN) .......................... 2017 1 1460267

(51) Int. Cl.
*H01L 27/12* (2006.01)
*G02F 1/1333* (2006.01)
(Continued)

(52) U.S. Cl.
CPC ........ *H01L 27/1288* (2013.01); *G02F 1/1362* (2013.01); *G02F 1/133345* (2013.01);
(Continued)

(58) Field of Classification Search
CPC .................... H01L 27/1288; H01L 27/1296
See application file for complete search history.

(56) References Cited

U.S. PATENT DOCUMENTS 3,808,485 A * 4/1974 Sakai .................... B25J 19/021
318/480

FOREIGN PATENT DOCUMENTS

CN         202003137 U    10/2011
CN         103698931 A     4/2014
(Continued)

*Primary Examiner* — Quoc D Hoang
(74) *Attorney, Agent, or Firm* — Leong C. Lei

(57) ABSTRACT

A mask includes a plurality of completely-transmitting sections and a plurality of light-blocking sections. The completely-transmitting sections and the light-blocking sections are arranged alternate with each other. The light-blocking sections each include a non-light-transmitting sub-section and N light-transmitting sub-sections arranged between the non-light-transmitting sub-section and an adjacent one of the completely-transmitting sections. The N light-transmitting sub-sections have light transmission rates that are increased, step by step, in a direction from the non-light-transmitting sub-section to the completely-transmitting section, where N≥22 and N is an inter. Through modification of the structure of mask, grooves formed in a planarization layer of a non-display section with such a modified mask would have sidewalk that are smooth and the sidewalls having gentle slopes so that no residue of photoresist remains in a subsequent process.

10 Claims, 3 Drawing Sheets

(51) Int. Cl.
*G02F 1/1362* (2006.01)
*G03F 1/54* (2012.01)
*G03F 7/26* (2006.01)
*G03F 7/20* (2006.01)
*G02F 1/1337* (2006.01)
*G02F 1/1339* (2006.01)

(52) U.S. Cl.
CPC .................. *G03F 1/54* (2013.01); *G03F 7/20* (2013.01); *G03F 7/26* (2013.01); *G02F 1/1337* (2013.01); *G02F 1/1339* (2013.01); *G02F 2001/136236* (2013.01)

(56) References Cited

FOREIGN PATENT DOCUMENTS

| | | |
|---|---|---|
| CN | 104375331 A | 2/2015 |
| CN | 106681101 A | 5/2017 |
| JP | 2002-258489 A | 9/2002 |

\* cited by examiner

MASK HAVING INTERMEDIATE LIGHT-TRANSMITTING SUB-SECTIONS OF STEPWISELY INCREASED TRANSMISSION RATES

RELATED APPLICATIONS

The present application is a National Phase of International Application Number PCT/CN2018/076544, filed Feb. 12, 2018, and claims the priority of China Application No. 201711460267.9, filed Dec. 28, 2017.

BACKGROUND OF THE INVENTION

1. Field of the Invention

The present invention relates to the field of technology for manufacturing display panel, and more particularly to a mask, a display panel and a manufacturing method of a non-display section thereof.

2. The Related Arts

In the fabrication of low temperature poly-silicon display panels, a non-display section (namely non-display area) of the display panel is designed with planarization layer grooves. This is for preventing overflowing in coating an alignment film and is also to allow for coating an additional amount of enclosure rein in the planarization layer groove to improve adhesive bonding power of the enclosure resin. However, in the conventional low temperature poly-silicon display panels, the planarization layer grooves of the non-display section have sides that are excessively steep, and in coating photoresist in exposure and development processes of other films/layers conducted after the planarization layer, a thickness of the photoresist that is formed at the sides of the planarization layer grooves would be greater than that formed at non-grooved areas of the planarization layer. This results in residues of the photoresist remaining on the sides of the planarization layer grooves after the exposure and development processes of said other films/layers and a part of the films/layers that is covered by the residues of photoresist may not be etched off in a subsequent wet etching process.

FIG. 1 is a schematic view showing the formation of grooves in a planarization layer using a known mask. In FIG. 1, completely-transmitting portions 10 and partly-transmitting portions 20 are arranged alternate. This allows for formation of multiple grooves 30 in a planarization layer PLN. However, the angle "a" between a side wall of the groove 30 of the prior art and a base plate 40 is relatively large and may cause remaining of photoresist as discussed above. FIG. 2 is a schematic view illustrating a situation of photoresist coating in forming other films/layers subsequent to the planarization layer. As shown in FIG. 2, the photoresist 50 has a greater thickness deposited at a connection between the sidewall of the groove 30 and the base plate 40 than that at other areas of the planarization layer PLN.

SUMMARY OF THE INVENTION

To overcome the above problem of the prior art, an object of the present invention is to provide a mask, which comprises a plurality of completely-transmitting sections and a plurality of light-blocking sections. The completely-transmitting sections and the light-blocking sections are arranged alternate with each other. The light-blocking sections each comprise a non-light-transmitting sub-section and N light-transmitting sub-sections arranged between the non-light-transmitting sub-section and the completely-transmitting sections. The N light-transmitting sub-sections have light transmission rates that are increased, step by step, in a direction from the non-light-transmitting sub-section to one of the completely-transmitting sections adjacent thereto, wherein $N \geq 2$ and N is an integer.

Further, a first light-transmitting sub-section to an Nth light-transmitting sub-section are arranged, in sequence in the direction from the non-light-transmitting sub-section to the completely-transmitting section, between the non-light-transmitting sub-section and the completely-transmitting section.

Further, the light transmission rate of an ith light-transmitting sub-section is $i/(N+1)$ of a light transmission rate of the completely-transmitting sections, wherein $1 \leq i \leq N$ and N is an integer, Another object of the present invention is to provide a display panel, which comprises a display section and a non-display section. The display section comprises: a base plate and a planarization layer formed on the base plate. The planarization layer comprises a plurality of grooves formed therein by using the mask described above.

Further, the display section comprises a plurality of pixels arranged in an array.

A further object of the present invention is to provide a method for manufacturing a non-display section of a display panel, which comprises: providing a base plate; forming a planarization layer on the base plate; and forming a plurality of grooves in the planarization layer by using a mask, wherein the mask is the mask described above.

The efficacy of the present invention is that the present invention provides modification of a structure of a mask, and grooves formed in a planarization layer of a non-display section with such a modified mask would have sidewalls that are smooth and the sidewalls having gentle slopes so that no residue of photoresist remains in a subsequent process.

BRIEF DESCRIPTION OF THE DRAWINGS

The above and other aspects, features, and advantages of embodiments of the present invention will become more apparent with reference to the illustration provided below in combination with the attached drawing. In the drawings.

DETAILED DESCRIPTION OF THE PREFERRED EMBODIMENTS

Figure 1:
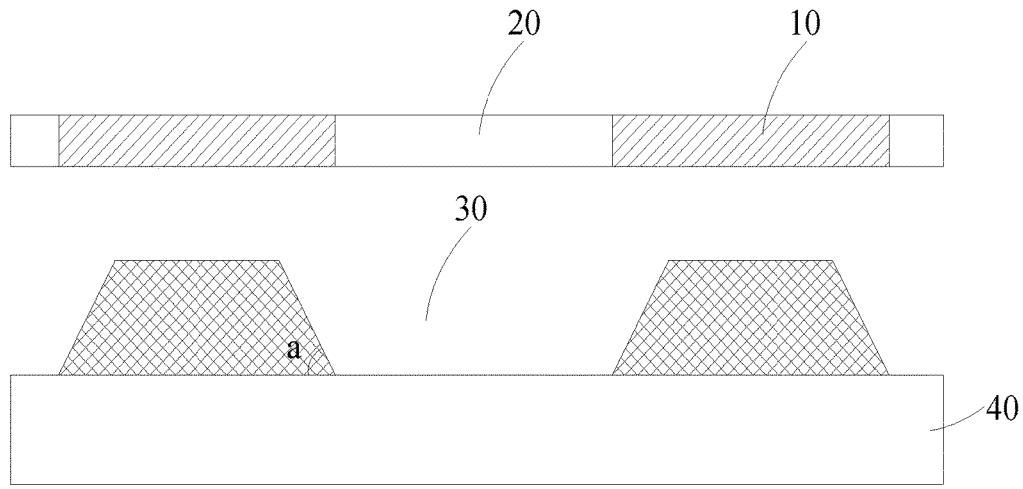
FIG. 1 is a schematic view showing the formation of grooves in a planarization layer using a known mask.
Figure 2:
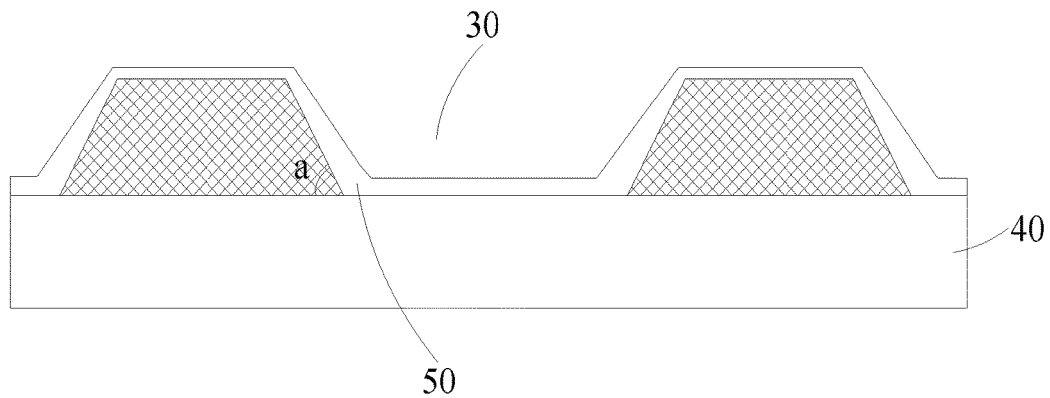
FIG. 2 is a schematic view illustrating a situation of photoresist coating in forming other films/layers subsequent to a planarization layer.

Embodiments of the present invention will be described below. However, these embodiments can be put into practice in various forms and this invention should not be construed as being limited to such embodiments. Oppositely, these embodiments are provided just for the purpose of explaining the principle of this invention and practical applications thereof, in order to allow skilled persons of this field to appreciate various embodiments of this invention and various modifications thereof that suit to specific predetermined applications.

In the drawings, for clear illustration, thickness of layers and areas may be exaggerated. Throughout the entire disclosure and drawings, similar reference numerals are used to designate the same elements.

Figure 3:
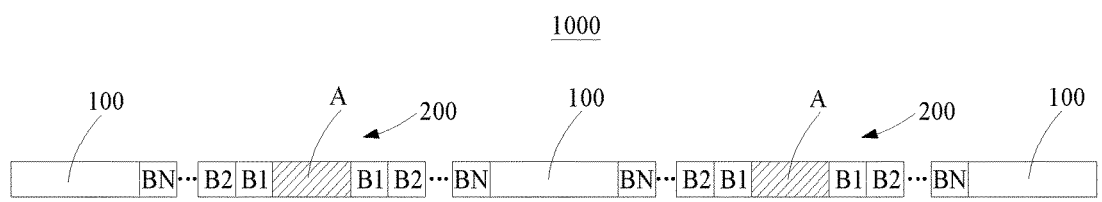
FIG. 3 is a schematic view showing a mask according to an embodiment of the present invention.

FIG. 3 is a schematic view showing a mask according to an embodiment of the present invention.

Referring to FIG. 3, a mask 1000 according to an embodiment of the present invention comprises a plurality of completely-transmitting sections 100 and a plurality of light-blocking sections 200. The completely-transmitting sections 100 and the light-blocking sections 200 are arranged alternate with each other. Although only three completely-transmitting sections 100 and two light-blocking sections 200 are shown in FIG. 3, the numbers of the two can be selected according to actual requirements and this invention is not limited thereto.

Each of the light-blocking sections 200 comprises a non-light-transmitting sub-section A and N light-transmitting sub-sections B B2, . . . , BN arranged between the non-light-transmitting sub-section A and the completely-transmitting sections 100. In other words, the non-light-transmitting sub-section A and each of the two completely-transmitting sections 100 located on two opposite sides thereof are provided N light-transmitting sub-sections B1, B2, . . . , BN in between. The N light-transmitting sub-sections B1, B2, . . . , BN have light transmission rates that are increased step by step in a direction from the non-light-transmitting sub-section A to the completely-transmitting section 100, where N≥2 and N is an integer.

Further, in the instant embodiment, the first light-transmitting sub-section B1 to the Nth light-transmitting sub-section BN are sequentially arranged, in the direction from the non-light-transmitting sub-section A to the completely-transmitting section 100, between the non-light-transmitting sub-section A and the completely-transmitting section 100; however, this invention is not limited thereto.

Further, in the instant embodiment, preferably, the light transmission rate of the ith light-transmitting sub-section Bi ($1 \leq i \leq N$) is set as $1/(N+1)$ of the light transmission rate of the completely-transmitting section 100; however, this invention is not limited thereto and other ratios may be adopted provided the light transmission rates of the N light-transmitting sub-sections B1, B2, . . . , BN in increased step by step in the direction from the non-light-transmitting sub-section A to the completely-transmitting section 100.

For example, in a case where N is 3, the first light-transmitting sub-section B1, the second light-transmitting sub-section B2, and the third light-transmitting sub-section B3 are arranged, in sequence in a direction from the non-light-transmitting sub-section A to the completely-transmitting section 100, between the non-light-transmitting sub-section A and the completely-transmitting section 100. Further, the light transmission rate of the first light-transmitting sub-section B1 is ¼ of the light transmission rate of the completely-transmitting sections 100; the light transmission rate of the second light-transmitting sub-section B2 is ²⁄₄ of the light transmission rate of the completely-transmitting sections 100; and the light transmission rate of the third light-transmitting sub-section B3 is ¾ of the light transmission rate of the completely-transmitting sections 100.

A detailed description will be given below concerning formation of grooves in a planarization layer of a non-display section of a display panel with the mask shown in FIG. 3. A display panel according to an embodiment of the present invention will be described first.

Figure 4:
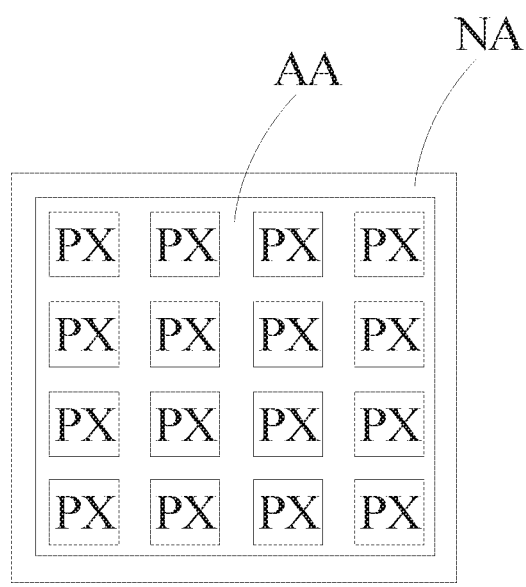
FIG. 4 is a planar view showing a display panel according to an embodiment of the present invention.

FIG. 4 is a planar view showing a display panel according to an embodiment of the present invention.

Referring to FIG. 4, a display panel according to an embodiment of the present invention comprises a display section (or a display area) AA and a non-display section (or a non-display area) NA surrounding the display section AA. The display section AA generally includes a plurality of pixels PX arranged in an array and scan lines and data lines (both being not shown) that supply signals to the pixels PX. The pixels PX generally comprise thin-film transistors and pixel electrode. During the formation of the thin-film transistors, films/layers of the non-display section NA are also formed at the same time.

As described hereinabove in the related arts, the non-display section NA generally comprises a planarization layer, and the planarization layer is formed with grooves to prevent overflowing in coating an alignment film and also to coat an additional amount of enclosure resin in the grooves to increase adhesive bonding force of the enclosure resin. A detailed description is provided blow concerning formation of the grooves in the planarization layer of the non-display section AA by using the mask shown in FIG. 3.

Figure 5A:
FIGS. 5A-5C illustrate a process of manufacturing a non-display section of the display panel according to an embodiment of the present invention.
Figure 5B:
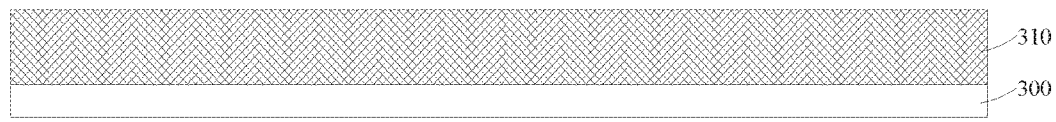
Figure 5C:
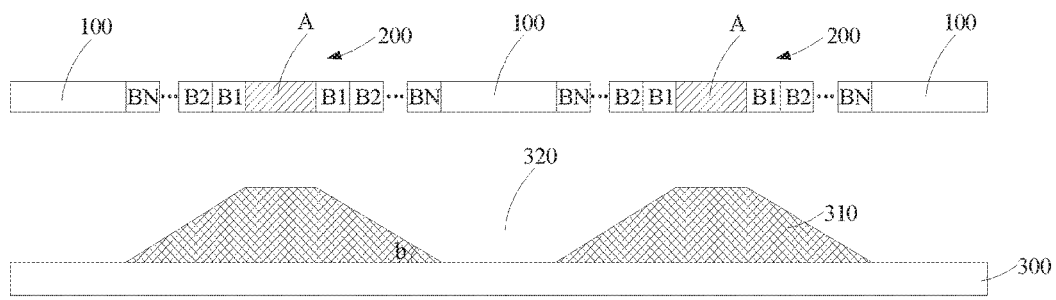

FIGS. 5A-5C illustrate a process of manufacturing the non-display section of the display panel according to an embodiment of the present invention.

Firstly, referring to FIG. 5A, a base plate 300 is provided. It is appreciated that the base plate 300 is also used in the display section AA to carry and support the films/layers formed therein.

Next, referring to FIG. 5B, a planarization layer 310 is formed on the base plate 300.

Finally, referring to FIG. 5C the mask 1000 shown in FIG. 3 is used to form a plurality of grooves 320 in the planarization layer 310.

Figure 6:
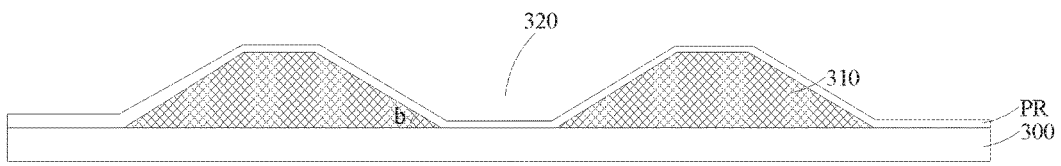
FIG. 6 is a schematic view illustrating a situation of photoresist coating in forming other films/layers subsequent to a planarization layer according to an embodiment of the present invention.

Further, a specific process of using the mask the mask 1000 shown in FIG. 3 to form a plurality of grooves 320 in the planarization layer 310 comprises: firstly, using the mask 1000 to subject the planarization layer 310 to exposure; secondly, subjecting the planarization layer 310 so exposed to development; and thirdly, subjected the planarization layer 310 so developed to etching treatment to form the plurality of grooves 320, In the instant embodiment, since the light-blocking sections 200 each have N light-transmitting sub-sections B1, B2, . . . , BN and the light transmission rates of the N light-transmitting sub-sections B1, B2, . . . , EN are increased step by step in a direction from the non-light-transmitting sub-section A to the completely-transmitting section 100, the grooves 320 formed in the planarization layer 310 would have sidewalls that form, together with the base plate 300, an included angle "b", which is smaller than the included angle "a" shown in FIG. 1 (meaning the sidewalls of the grooves 320 have slopes that are gentle), and the sidewalls of the grooves 320 are smoother. As such, in forming other films/layers posterior to the planarization layer 310, photoresist PR coated on the sidewalls and bottoms of the grooves 320 and remaining portions of the planarization layer 310 would be of generally similar thickness, as shown in FIG. 6, so that no residues of photoresist would remain after exposure and development processes of said other films/layers.

In summary, through modification of a structure of a mask, grooves formed in a planarization layer of a non-display section with such a modified mask would have sidewalls that are smooth and the sidewalls having gentle slopes so that no residue of photoresist remains in a subsequent process.

Although a description has been given to the present invention with reference to specific embodiments, it is appreciated by those having ordinary skills in the field that various modifications in respect of form and detail can be made without departing from the spirit and scope of this invention as defined in the appended claims and equivalents thereof.

What is claimed is:

1. A mask, comprising a plurality of completely-transmitting sections and a plurality of light-blocking sections, the completely-transmitting sections and the light-blocking sections being arranged alternate with each other, the light-blocking sections each comprising a non-light-transmitting sub-section and N light-transmitting sub-sections arranged between the non-light-transmitting sub-section and the completely-transmitting sections, the N light-transmitting sub-sections having light transmission rates that are increased, step by step, in a direction from the non-light-transmitting sub-section to one of the completely-transmitting sections adjacent thereto, wherein N>2 and N is an integer;

wherein the plurality of completely-transmitting sections and the plurality of light-blocking sections are alternate with each other such that the non-light-transmitting sub-section of each of the plurality of light-blocking sections is located between two of the plurality of completely-transmitting sections and has two sides that respectively correspond to the two completely-transmitting sections, the two sides of the non-light-transmitting sub-section being each provided with the N light-transmitting sub-sections that connect the side of the non-light-transmitting sub-section to a respective one of the two completely-transmitting sections.

2. The mask according to claim 1, wherein a first light-transmitting sub-section to an Nth light-transmitting sub-section are arranged, in sequence in the direction from the non-light-transmitting sub-section to the completely-transmitting section, between the non-light-transmitting sub-section and the completely-transmitting section.

3. The mask according to claim 2, wherein the light transmission rate of an ith light-transmitting sub-section is i/(N+1) of a light transmission rate of the completely-transmitting sections, wherein $1 \leq i \leq N$ and N is an integer.

4. A display panel, comprising a display section and a non-display section, wherein the display section comprises: a base plate and a planarization layer formed on the base plate, the planarization layer comprising a plurality of grooves formed therein by using the mask according to claim 1.

5. The display panel according to claim 4, wherein the display section comprises a plurality of pixels arranged in an array.

6. The display panel according to claim 4, wherein the first light-transmitting sub-section to the Nth light-transmitting sub-section are arranged, in sequence in a direction from the non-light-transmitting sub-section to the completely-transmitting section, between the non-light-transmitting sub-section and the completely-transmitting section.

7. The display panel according to claim 6, wherein the light transmission rate of an ith light-transmitting sub-section is i/(N+1) of a light transmission rate of the completely-transmitting sections, wherein $1 \leq i \leq N$ and N is an integer.

8. A method for manufacturing a non-display section of a display panel, comprising:
providing a base plate;
forming a planarization layer on the base plate; and
forming a plurality of grooves in the planarization layer by using a mask, the mask being the mask according to claim 1.

9. The method according to claim 8, wherein a process of forming the plurality of grooves in the planarization layer by using the mask comprises:
using the mask to subject the planarization layer to exposure;
subjecting the planarization layer so exposed to development; and
subjecting the planarization layer so developed to etching treatment to form the plurality of grooves.

10. The method according to claim 8, wherein the first light-transmitting sub-section to the Nth light-transmitting sub-section are arranged, in sequence in a direction from the non-light-transmitting sub-section to the completely-transmitting section, between the non-light-transmitting sub-section and the completely-transmitting section, the light transmission rate of the ith light-transmitting sub-section being i/(N+1) of a light transmission rate of the completely-transmitting sections, wherein $1 \leq i \leq N$ and N is an integer.

* * * * *